United States Patent
Lelental et al.

(10) Patent No.: US 6,709,808 B2
(45) Date of Patent: Mar. 23, 2004

(54) IMAGING MATERIALS COMPRISING ELECTRICALLY CONDUCTIVE POLYMER PARTICLE LAYERS

(75) Inventors: Mark Lelental, Rochester, NY (US); Gary M. Mosehauer, Webster, NY (US); Roger J. Owers, Leighton Buzzard (GB); James L. Wakley, Brockport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/139,684

(22) Filed: May 6, 2002

(65) Prior Publication Data

US 2003/0008247 A1 Jan. 9, 2003

Related U.S. Application Data

(60) Provisional application No. 60/290,721, filed on May 14, 2001.

(51) Int. Cl.[7] .............................. G03C 1/83; G03C 1/89
(52) U.S. Cl. ....................... 430/517; 430/527; 430/528; 430/529
(58) Field of Search ................................ 430/527, 517, 430/528, 529

(56) References Cited

U.S. PATENT DOCUMENTS

| | | | | | |
|---|---|---|---|---|---|
| 4,308,332 | A | * | 12/1981 | Upson et al. | 430/527 |
| 5,137,802 | A | | 8/1992 | Ueda et al. | |
| 5,288,598 | A | | 2/1994 | Sterman et al. | |
| 5,312,681 | A | * | 5/1994 | Muys et al. | 430/527 |
| 5,368,894 | A | | 11/1994 | Lammers et al. | |
| 5,453,350 | A | * | 9/1995 | Kurachi et al. | 430/527 |
| 5,582,959 | A | | 12/1996 | Ito | |
| 5,665,498 | A | * | 9/1997 | Savage et al. | 430/529 |
| 5,716,550 | A | * | 2/1998 | Gardner et al. | 430/529 |
| 5,747,412 | A | * | 5/1998 | Leenders et al. | 430/527 |
| 5,849,472 | A | * | 12/1998 | Wang et al. | 430/527 |
| 5,912,109 | A | * | 6/1999 | Anderson et al. | 430/527 |
| 5,955,250 | A | * | 9/1999 | Christian et al. | 430/527 |
| 6,060,229 | A | * | 5/2000 | Eichorst et al. | 430/527 |
| 6,077,655 | A | * | 6/2000 | Majumdar et al. | 430/527 |
| 6,124,083 | A | * | 9/2000 | Majumdar et al. | 430/527 |
| 6,225,040 | B1 | * | 5/2001 | Muys et al. | 430/527 |
| 6,287,754 | B1 | * | 9/2001 | Melpolder et al. | 430/527 |
| 6,355,406 | B2 | * | 3/2002 | Majumdar et al. | 430/527 |
| 6,440,654 | B1 | * | 8/2002 | Anderson et al. | 430/527 |
| 6,479,228 | B2 | * | 11/2002 | Majumdar et al. | 430/527 |

OTHER PUBLICATIONS

Jp Abstract 63–063035, published Mar. 19, 1988.

* cited by examiner

Primary Examiner—Richard L. Schilling
(74) Attorney, Agent, or Firm—J. Lanny Tucker

(57) ABSTRACT

Image-forming materials including photographic, thermographic, and thermally-developable imaging materials include one or more transparent electrically conductive, non-charging layers to provide antistatic control on one or both sides of subbed or unsubbed supports. The electrically conductive, non-charging layers comprise colloidal, electrically conductive polymer particles that can be dispersed in a film-forming binder in an amount to provide from about 10 to about 90 volume % of polymer particles. Particularly useful polymer particles include pyrrole-containing, thiophene-containing, and aniline-containing polymers. The particles generally exhibit a packed powder specific resistivity of $10^5$ ohm-cm or less and generally have a mean diameter of 0.5 $\mu$m or less. The electrically conductive, non-charging layers generally exhibit a surface electrical resistivity of less than $1 \times 10^{12}$ ohm per square.

38 Claims, No Drawings

IMAGING MATERIALS COMPRISING ELECTRICALLY CONDUCTIVE POLYMER PARTICLE LAYERS

RELATED APPLICATION

This application is based on Provisional Application No. 60/290,721 filed May 14, 2001 by Lelental, Mosehauer, Owers, and Wakley.

FIELD OF THE INVENTION

This invention relates generally to multilayer imaging materials one or more electrically conductive, non-charging layers on either or both sides of a subbed or unsubbed support. This invention is directed to imaging sciences in general and photography, thermography, photothermography more specifically.

BACKGROUND OF THE INVENTION

Problems associated with the generation and discharge of electrostatic charge during the manufacture and use of photographic film and paper products have been recognized for many years by the photographic industry. The accumulation of static charge on film or paper surfaces can cause irregular static marking fog patterns in the emulsion layer. The presence of static charge also can lead to difficulties in support conveyance as well as the attraction of dust, which can result in, fog, desensitization, and other physical defects during emulsion coating. The discharge of accumulated charge during or after the application of the sensitized emulsion layer(s) also can produce irregular fog patterns or "static marks" in the emulsion layer. The severity of static-related problems has been exacerbated greatly by increases in the sensitivity of new emulsions, increases in coating machine speeds, and increases in post-coating drying efficiency.

The generation of electrostatic charge during the coating process results primarily from the tendency of webs to undergo triboelectric charging during winding and unwinding operations, during conveyance through the coating machines, and during finishing operations such as slitting and spooling.

Static charge can also be generated during the use of the final photographic film product. In an automatic camera, the winding of roll film out of and back into the film cassette, especially in a low relative humidity environment, can result in static charging and marking. Similarly, high-speed automated film processing equipment can produce static charging resulting in marking. Sheet films are especially subject to static charging during use in automated high-speed film cassette loaders (for example, radiographic and graphic arts films).

It is widely known and accepted that accumulated electrostatic charge can be dissipated effectively by incorporating one or more electrically conductive "antistatic" layers into the overall film structure. Antistatic layers can be applied to one or to both sides of the film support as subbing layers either underlying or on the side opposite to the sensitized emulsion layer. Alternatively, an antistatic layer can be applied as the bottom layers, intermediate layers, or outermost coated layer either over the emulsion layers (that is, as an overcoat) or on the side of the film support opposite to the emulsion layers (that is, as a back coat) or both.

A wide variety of electrically conductive materials can be incorporated in antistatic layers to produce a broad range of surface conductivities. Many of the traditional antistatic layers used for photographic applications employ materials that exhibit predominantly ionic conductivity. Antistatic layers containing simple inorganic salts, alkali metal salts of surfactants, alkali metal ion-stabilized colloidal metal oxide sols, ionic conductive polymers or polymeric electrolytes containing alkali metal salts and the like have been taught in the art. The electrical conductivities of such ionic conductors are typically strongly dependent on the temperature and relative humidity of the surrounding environment. At low relative humidity and low temperatures, the diffusion mobility of the charge carrying ions are greatly reduced and the bulk conductivity is substantially decreased. At high relative humidity, an exposed antistatic back coating can absorb water, swell, and soften. Especially in the case of roll films, this can result in a loss of adhesion between layers as well as physical transfer of portions of the back coating to the emulsion side of the film (viz. blocking). Also, many of the inorganic salts, polymeric electrolytes, and low molecular weight surface-active agents typically used in such antistatic layers are water soluble and can be leached out during film processing, resulting in a loss of antistatic function.

One of the numerous methods proposed in the art for increasing the electrical conductivity of the surface of photographic light-sensitive materials in order to dissipate accumulated electrostatic charge involves the incorporation of at least one of a wide variety of surfactants or coating aids in the outermost (surface) protective layer overlying the emulsion layer(s). A wide variety of ionic-type surfactants have been evaluated as antistatic agents including anionic, cationic, and betaine-based surfactants. The use of nonionic surfactants having at least one polyoxyethylene group as antistatic agents has been disclosed. Further, surface protective layers containing nonionic surfactants having at least two polyoxyethylene groups have been disclosed.

In order to provide improved performance, the incorporation of an anionic surfactant having at least one polyoxyethylene group in combination with a nonionic surfactant having at least one polyoxyethylene group in the surface layer was disclosed in U.S. Pat. No. 4,649,102. A further improvement in antistatic performance by incorporating a fluorine-containing ionic surfactant having a polyoxyethylene group into a surface layer containing either a nonionic surfactant having at least one polyoxyethylene group or a combination of nonionic and anionic surfactants having at least one polyoxyethylene group was disclosed in U.S. Pat. Nos. 4,510,233 and 4,649,102. Additionally, surface or backing layers comprising a combination of specific cationic and anionic surfactants having at least one polyoxyethylene group in each which form a water-soluble or dispersible complex with a hydrophilic colloid binder are disclosed in European Patent Publication 650,088 and British Patent Publication 2,299,680.

Surface layers containing either non-ionic or anionic surfactants having polyoxyethylene groups often demonstrate specificity in their antistatic performance such that good performance can be obtained against specific supports and photographic emulsion layers but poor performance results when they are used with others. Surface layers containing fluorine-containing ionic surfactants generally exhibit negatively charged triboelectrification when brought into contact with various materials. Such fluorine-containing ionic surfactants exhibit variability in triboelectric charging properties after extended storage, especially after storage at high relative humidity.

However, it is possible to reduce triboelectric charging from contact with specific materials by incorporating into a surface layer other surfactants which exhibit positively charged triboelectrification against these specific materials. The dependence of the triboelectrification properties of a surface layer on those specific materials with which it is brought into contact can be somewhat reduced by adding a large amount of fluorine-containing nonionic surfactants.

However, the use of a large amount of said fluorine-containing surfactants results in decreased emulsion sensitivity, increased tendency for blocking, and increased dye staining during processing. Thus, it is extremely difficult to minimize the level of triboelectric charging against all those materials with which an imaging element may come to contact without seriously degrading other requisite performance characteristics of the imaging element.

The inclusion in a surface or backing layer of a combination of three kinds of surfactants, comprising at least one fluorine-containing nonionic surfactant, and at least one fluorine-containing ionic surfactant, and a fluorine-free nonionic surfactant has been disclosed to reduce triboelectric charging, prevent dye staining on processing, maintain antistatic properties on storage, and preserve sensitometric properties of the photosensitive emulsion layer. The level of triboelectric charging of surface or backing layers containing said combination of surfactants against dissimilar materials (for example, rubber and nylon) is alleged to be such that little or no static marking of the sensitized emulsion occurs. The incorporation of another antistatic agent such as colloidal metal oxide particles into the surface layer containing a combination of surfactants is also known.

The use of a hardened gelatin-containing conductive surface layer containing a soluble antistatic agent (for example TERGITOL 15-S-7), an aliphatic sulfonate-type surfactant (for example HOSTAPUR SAS-93), a matting agent (for example silica, titania, zinc oxide, and polymeric beads), and a friction-reducing agent (for example Slip-Ayd SL-530) for graphic arts and medical x-ray films has been described in U.S. Pat. No. 5,368,894.

Further, a method for producing such a multilayered photographic element in which the conductive surface layer is applied in tandem with the underlying sensitized emulsion layer(s) is also described in U.S. Pat. No. 5,368,894. A surface protective layer comprising a composite matting agent consisting of a polymeric core particle surrounded by a layer of colloidal metal oxide particles and optionally, conductive metal oxide particles and a nonionic, anionic or cationic surfactant has been disclosed in U.S. Pat. No. 5,288,598.

An electroconductive protective overcoat overlying a sensitized silver halide emulsion layer of a black-and white photographic element comprising at least two layers both containing granular conductive metal oxide particles and gelatin but at different metal oxide particle-to-gelatin weight ratios has been taught in Japanese Kokai 63-063035. The outermost layer of said protective layer contains a substantially lower total dry coverage of conductive metal oxide (for example, 0.75 g/m$^2$ compared to 2.5 g/m$^2$) present at a lower metal oxide particle-to-gel weight ratio (e.g., 2:1 vs 4:1) than that of the innermost conductive layer.

Antistatic layers incorporating electronic rather than ionic conductors also have been described extensively in the art. Because the electrical conductivity of such layers depends primarily on electronic mobility rather than on ionic mobility, the observed conductivity is independent of relative humidity and only slightly influenced by ambient temperature. Antistatic layers containing conjugated conductive polymers, conductive carbon particles, crystalline semiconductor particles, amorphous semiconductive fibrils, and continuous semiconductive thin films or networks are well known in the art. Of the various types of electronic conductors previously described, electroconductive metal-containing particles, such as semiconductive metal oxide particles, are particularly effective. Fine particles of crystalline metal oxides doped with appropriate donor heteroatoms or containing oxygen deficiencies are sufficiently conductive when dispersed with polymeric film-forming binders to be used to prepare optically transparent, humidity insensitive, antistatic layers useful for a wide variety of imaging applications. Suitable conductive metal oxides include zinc oxide, titania, tin oxide, alumina, indium oxide, zinc and indium antimonates, silica, magnesia, zirconia, barium oxide, molybdenum trioxide, tungsten trioxide, and vanadium pentoxide. Of these, the semiconductive metal oxide most widely used in conductive layers for imaging elements is a crystalline antimony-doped tin oxide, especially with a preferred antimony dopant level between 0.1 and 10 atom percent Sb (for $Sb_xSn_{1-x}O_2$) as disclosed in U.S. Pat. No. 4,394,441.

Electrically conducting polymers have recently received attention from various industries because of their electronic conductivity. Although many of these polymers are highly colored and are less suited for photographic applications, some of these electrically conducting polymers, such as substituted or unsubstituted pyrrole-containing polymers (as mentioned in U.S. Pat. Nos. 5,665,498 and 5,674,654), substituted or unsubstituted thiophene-containing polymers (as mentioned in U.S. Pat. Nos. 5,300,575, 5,312,681, 5,354,613, 5,370,981, 5,372,924, 5,391,472, 5,403,467, 5,443,944, 5,575,898, 4,987,042, and 4,731,408) and substituted or unsubstituted aniline-containing polymers (as mentioned in U.S. Pat. Nos. 5,716,550, 5,093,439, and 4,070,189) are transparent and not prohibitively colored, at least when coated in thin layers at moderate coverage. Because of their electronic conductivity instead of ionic conductivity, these polymers are conducting even at low humidity. Moreover, some of these polymers can retain sufficient conductivity even after wet chemical processing to provide what is known in the art as "process-surviving" antistatic characteristics to the photographic support they are applied. Unlike metal-containing semi-conducting particulate antistatic materials (e.g., antimony-doped tin oxide), the aforementioned electrically conducting polymers are less abrasive, environmentally more acceptable (due to absence of heavy metals).

The use of electroconductive antimony-doped tin oxide granular particles in combination with at least one fluorine-containing surfactant in a surface, overcoat or backing layer has been disclosed broadly in U.S. Pat. Nos. 4,495,276, 4,999,276, 5,122,445, 5,238,801, 5,254,448, and 5,378,577 and also in Japanese Kokai 07-020,610 and Japanese Kokoku 91-024,656B1. Such fluorine-containing surfactants are preferably located in the same layer as the electroconductive tin oxide particles to provide improved antistatic performance. A surface protective layer or a backing layer comprising at least one fluorine-containing surfactant, at least one nonionic surfactant having at least one polyoxyethylene group, and optionally one or both of electroconductive metal oxide granular particles or a conductive polymer or conductive latex is disclosed in U.S. Pat. No. 5,582,959.

Similarly, a silver halide photographic material comprising an outermost layer overlying a sensitized silver halide emulsion layer containing an organopolysiloxane and a nonionic surfactant having at least one polyoxyethylene group, optionally combined with or replaced by one or more fluorine-containing surfactants or polymers, and a backing layer containing electroconductive metal oxide particles is disclosed in U.S. Pat. No. 5,137,802. Such backing layer is located on the opposite side of the support from an outermost layer overlying the emulsion layer.

The incorporation of an organopolysiloxane, a nonionic surfactant having a polyoxyethylene group and/or a fluorine-containing surfactant or polymer in an outermost layer was disclosed as providing excellent antistatic performance with a minimum degree of deterioration with storage time, and negligible occurrence of static marking.

As indicated herein above, the art discloses a wide variety of overcoat layer compositions. However, there is still a critical need in the art for a conductive overcoat that not only effectively dissipates accumulated electrostatic charge, but also minimizes triboelectric charging against a wide variety of materials with which the imaging element may come into contact. In addition to providing superior antistatic performance, the conductive overcoat layer also must be highly transparent, must resist the effects of humidity change, strongly adhere to the underlying layer, exhibit suitable mushiness, not exhibit ferrotyping or blocking, not exhibit adverse sensitometric effects, not impede the rate of development, not exhibit dusting, and still be manufacturable at a reasonable cost.

It is toward the objective of providing such improved electrically conductive, non-charging overcoat layers that more effectively meet the diverse needs of imaging elements, especially of silver halide photographic films, than those of the prior art that the present invention is directed.

SUMMARY OF THE INVENTION

The present invention provides a multilayer imaging material for use in an image-forming process comprising a subbed or unsubbed support, and having disposed thereon, one or more image-forming layers and one or more transparent electrically conductive, non-charging layers each of which comprises colloidal, electrically conductive polymer particles.

Such electrically conductive, non-charging layers can be antistatic layers, interlayers, or overcoat layers comprising one or more electrically conductive polymers, optionally one or more charge control agents, one or more polymeric film-forming binders, and various optional additives.

The image-forming layers may include silver halide-containing sensitized emulsion layers useful in a wide variety of imaging materials. The electrically conductive, antistatic overcoat layer, either directly overlies one or more image-forming layers and/or intermediate layers, as an outermost or surface layer.

The surface electrical resistivity (SER) of said electrically conductive antistatic layer is nominally independent of relative humidity and is retained after exposure to aqueous solutions having a wide range of pH values (e.g., $2 \leq pH \leq 13$) used in conventional photographic wet-solution processing. The electrically conductive layers can be coated simultaneously with image-forming layers using conventional slide, bead, or curtain coating techniques and equipment.

The transparent, electrically conductive, non-charging layers useful in the present invention serve to protect the image-forming layers (such as photographic, thermographic, or photothermographic emulsion layers) from the effects of accumulated electrostatic charge, such as dirt attraction, physical defects during manufacturing, uneven motion during conveyance, and irregular 'fog' patterns resulting from triboelectric charging as well as from static marking resulting from the discharge of accumulated electrostatic charge. Preferably, such electrically conductive, antistatic layers comprise both the electrically conductive polymeric particles to provide superior dissipation of accumulated electrostatic charge and at least one and preferably multiple charge control agents to minimize the level of triboelectric charging.

Useful combinations of charge control agents can comprise a mixture of at least one of a suitable negatively-charging anionic charge control agent and at least one suitable positively-charging anionic charge control agent at low concentrations optimized to minimize triboelectric charging.

Such preferred electrically conductive layers useful in the present invention provide superior antistatic protection relative to conductive layers described in the prior art that contain only surfactants since in order to increase conductivity of such layers it is necessary to increase the surfactant concentration that also can increase the level of triboelectric charging.

The present invention further provides an improved method for preparing imaging elements comprising the noted electrically conductive layer(s). The resulting imaging materials are generally highly transparent and exhibit superior antistatic performance, resistance to triboelectric charging, mushiness, adhesion to the underlying layers, and base wettability characteristics for a given dry weight laydown of electrically conductive polymeric particles compared to imaging elements comprising conductive subbing layers taught in prior art at comparable dry weight laydowns of electrically conductive metal-containing particle and conductive particle to polymeric binder ratios.

DETAILED DESCRIPTION OF THE INVENTION

The method for preparing the noted electrically conductive layers in accordance with this invention comprises preparing a stable aqueous colloidal dispersion of one or more electrically conductive polymeric materials. Preferably, such colloidal dispersions are combined with at least one charge control agent, one or more polymeric film-forming binders, thickeners, and other additives, and incorporated in an imaging element in the form of a thin underlayer, interlayer or overcoat layer.

The electrically conductive polymer particles can be coated out of aqueous coating compositions. The polymers can be chosen from any or a combination of electrically conductive polymers, such as substituted or unsubstituted pyrrole-containing polymers (as mentioned for example, in U.S. Pat. Nos. 5,665,498 and 5,674,654), substituted or unsubstituted thiophene-containing polymers (as mentioned for example, in U.S. Pat. Nos. 5,300,575, 5,312,681, 5,354, 613, 5,370,981, 5,372,924, 5,391,472, 5,403,467, 5,443,944, 5,575,898, 4,987,042, and 4,731,408), and substituted or unsubstituted aniline-containing polymers (as mentioned for example, in U.S. Pat. Nos. 5,716,550, 5,093,439, and 4,070, 189). Mixtures of each or several types of polymers can be used. All of these patents are incorporated herein by reference.

The electrically conductive polymers may be soluble or dispersible in organic solvents or water or mixtures thereof. For environmental reasons, aqueous systems are preferred. Polyanions used in these electrically conductive polymers include the anions of polymeric carboxylic acids such as polyacrylic acids, poly(methacrylic acid), and poly(maleic acid), and polymeric sulfonic acids such as polystyrene-sulfonic acids and polyvinylsulfonic acids, the polymeric sulfonic acids being preferred for use in this invention. These polycarboxylic and polysulfonic acids may also be copolymers formed from vinylcarboxylic and vinylsulfonic acid monomers copolymerized with other polymerizable monomers such as the esters of acrylic acid and styrene. The molecular weight of the polyacids providing the polyanions preferably is 1,000 to 2,000,000 and more preferably 2,000 to 500,000. The polyacids or their alkali salts are commonly available, for example as polystyrenesulfonic acids and polyacrylic acids, or they may be produced using known methods. Instead of the free acids required for the formation of the electrically conducting polymers and polyanions, mixtures of alkali salts of polyacids and appropriate amounts of monoacids may also be used.

Preferred electrically conductive polymers include polypyrrole/poly (styrene sulfonic acid), 3,4-dialkoxy substituted polypyrrole styrene sulfonate, and 3,4-dialkoxy substituted polythiophene styrene sulfonate.

While the electrically conductive polymer particles can be used without a binder in the various antistatic layers, preferably, they are dispersed in one or more polymeric, film-forming binders. In such embodiments, the volume fraction of electrically conductive polymer is preferably in the range of from about 10 to 90% of the volume of the polymer particle/binder dispersion. Preferably, the volume % of polymeric particles is from about 20 to about 80%. The use of significantly less than about 10 volume % polymer particles will not provide a useful level of surface electrical conductivity. The optimum volume ratio of polymer particles to film-forming polymer binder varies depending on the electrical properties of the polymer, binder type, and conductivity requirements of the particular image-forming material.

The choice of the particular combination of charge control agents to be used with the electrically conductive polymer in the antistatic layer can be advantageous to the benefits provided by the present invention. The combination of charge control agents and electrically conductive polymer can be optimized so as to provide a minimum (preferably zero) level of triboelectric charging and a maximum efficiency of electrostatic charge dissipation. Generally, the amount is from about 0.0001 to about 1 g/m². Typically, a suitable concentration of a negatively-charging charge control agent is used in combination with a suitable concentration of a positively-charging charge control agent. Combinations of charge control agents useful in antistatic layers of this invention comprise at least one of each of the following two groups of charge control agents, (i) and (ii):

(i) an anionic coating aid/charge control agent represented by the following formulae (1) and (2),

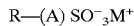

$$R-(A)SO_3^-M^+ \quad (1)$$

wherein R represents an alkyl, alkenyl group (preferably an alkyl group having 10 to 18 carbon atoms or alkenyl group having 14 to 18 carbon atoms) or akylaryl group (preferably an akyl aryl group having 12–18 carbon atoms, such as $C_8H_{17}-(C_6H_4)-$ or $C_9H_{19}-(C_6H_4)-$), A represents a single covalent bond or $-O-$ or $-(OCH_2CH_2)_m-O_n-$ or $-CONR_1-(CH_2)-$, wherein m is an integer from 1 to 8 and n is zero or 1, $R_1$ represents a hydrogen or an alkyl group having 1, 2, or 3 carbon atoms and $M^+$ represents an alkali metal cation (such as sodium or potassium), an ammonium group, or a substituted ammonium group.

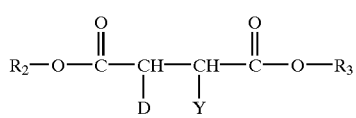

(2)

wherein $R_2$ and $R_3$ represent the same or different alkyl group or aryl group (which may be substituted) and where the preferred alkyl groups contain 6 to 14 carbon atoms, and substituted or unsubstituted aryl groups contain 6 to 20 carbon atoms, either D or Y is a hydrogen atom and the other is $-SO_3M$, wherein M is a cation as defined above for formula (1).

ii) a fluorine-containing anionic charge control agent having a fluoroalkyl, fluoroalkenyl, or fluoroalkylaryl group, and an anionic group such as sulfonate, sulfate, carboxylate, or phosphate that is represented by the following formulae (3), (4), or (5):

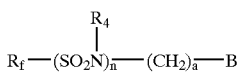

(3)

wherein $R_f$ represents a fluorinated alkyl, aryl, alkenyl, or alkylaryl groups having 6 to 14 carbon atoms and at least 7 fluorine atoms with 3 fluorine atoms on the end carbon atom, $R_4$ represents a methyl or ethyl group or a hydrogen atom, n has a value of 0 or 1, "a" has a value of 0 or integer 1, 2, 3, or 4, and B represents an anionic hydrophilic group such as $-SO_3M$, $-OSO_3M$, $-CO_2M$, or $-OPO_3M_2$, where M is a cation as defined above for formula (1).

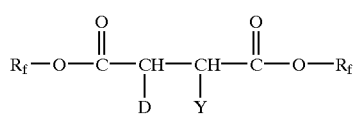

(4)

wherein $R_f$ and $R'_f$ represent the same or different fluorinated alkyl group or aryl group (which may be substituted) having 4 to 10 carbon atoms and at least 7 fluorine atoms, with 3 fluorine atoms on the end carbon atom, either D or Y is a hydrogen atom and the other is $-SO_3M$, wherein M is a cation defined above for formula (1), (5) is a mixture of:

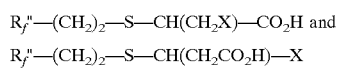

$$R_f''-(CH_2)_2-S-CH(CH_2X)-CO_2H \text{ and}$$
$$R_f''-(CH_2)_2-S-CH(CH_2CO_2H)-X \quad (5)$$

wherein $R_f''$ represents a mixture of perfluorinated alkyl groups having 6,8,10, and 12 carbon atoms, and X is $-CONH(CH_2)_3N(CH_3)_2$.

Polymeric film-forming binders useful in electrically conductive layers according to this invention include can include, but are not limited to, water-soluble or water-dispersible hydrophilic polymers such as gelatin, gelatin derivatives, maleic acid anhydride copolymers, cellulose derivatives (such as carboxymethyl cellulose, hydroxyethyl cellulose, cellulose acetate butyrate, diacetyl cellulose, and triacetyl cellulose), synthetic hydrophilic polymers (such as polyvinyl alcohol, poly-N-vinylpyrrolidone, acrylic acid copolymers, polyacrylamide, their derivatives and partially hydrolyzed products, vinyl polymers and copolymers such as polyvinyl acetate and polyacrylate acid ester), derivatives of the above noted polymers, and other hydrophilic synthetic resins that would be readily apparent to one skilled in the imaging arts. Other suitable binders include aqueous emulsions of addition-type polymers and interpolymers prepared from ethylenically unsaturated polymerizable monomers such as acrylates including acrylic acid, methacrylates including methacrylic acid, acrylamides and methacrylamides, itaconic acid and its half-esters and diesters, styrenes including substituted styrenes, acrylonitrile and methacrylonitrile, vinyl acetates, vinyl ethers, vinyl and vinylidene halides, and olefins and aqueous dispersions of polyurethanes or polyesterionomers. Gelatin and gelatin derivatives are the preferred binders in the practice of this invention.

Solvents useful for preparing dispersions and coatings of electrically conductive polymer particles by the method of this invention include, but are not limited to water, alcohols (such as methanol, ethanol, propanol, and isopropanol), ketones (such as acetone, methyl ethyl ketone, and methyl isobutyl ketone), esters (such as methyl acetate and ethyl acetate, glycol ethers such as methyl cellusolve, ethyl cellusolve), and mixtures of any of these solvents. Preferred solvents include water, alcohols, and acetone.

In addition to binders and solvents, other components that are well known in the photographic art may also be included in the electrically conductive layers used in this invention. Such addenda include but are not limited to matting agents, surfactants or coating aids, polymer lattices to improve dimensional stability, thickeners or viscosity modifiers, hardeners or crosslinking agents, soluble antistatic agents, soluble and/or solid particle dyes, antifoggants, lubricating agents, and various other conventional additives readily apparent to one skilled in the art.

Colloidal dispersions of electronically-conductive polymer particles formulated with or without charge control agents, polymeric binders, and additives can be applied to a variety of supports. Typical photographic film supports are preferred and include but are not limited to, cellulose nitrate, cellulose acetate, cellulose acetate butyrate, cellulose acetate propionate, poly(vinyl acetal), poly(carbonate), poly(styrene), poly(ethylene terephthalate), poly(ethylene naphthalate), poly(ethylene terephthalate), and poly(ethylene naphthalate) having included therein a portion of isophthalic acid, 1,4-cyclohexane dicarboxylic acid or 4,4-biphenyl dicarboxylic acid used in the preparation of the film support; polyesters wherein other glycols are employed such as, for example, cyclohexanedimethanol, 1,4-butanediol, diethylene glycol, polyethylene glycol, ionomers as described in U.S. Pat. No. 5,138,024, incorporated herein by reference (such as polyester ionomers prepared using a portion of the diacid in the form of 5-sodiosulfo-1, 3-isophthalic acid or like ion containing monomers), polycarbonates, and blends or laminates of the above noted polymers. Preferred photographic film supports are cellulose acetate, poly(ethylene terephthalate), and poly(ethylene naphthalate), and most preferably poly(ethylene naphthalate) that is prepared from 2,6-naphthalene dicarboxylic acids or derivatives thereof.

Suitable supports can be either transparent or opaque depending upon the application. Transparent film supports can be either colorless or colored by the addition of a dye or pigment. Film supports can be surface-treated by various processes including corona discharge, glow discharge, UV exposure, flame treatment, e-beam treatment, or treatment with adhesion-promoting agents including dichloro- and trichloroacetic acid, phenol derivatives such as resorcinol and p-chloro-m-cresol, solvent washing or overcoated with adhesion promoting primer or tie layers containing polymers such as vinylidene chloride-containing copolymers, butadiene-based copolymers, glycidyl acrylate or methacrylate-containing copolymers, maleic anhydride-containing copolymers, condensation polymers such as polyesters, polyamides, polyurethanes, polycarbonates, and mixtures and blends thereof. Other suitable opaque or reflective supports are paper, polymer-coated papers, including polyethylene-, polypropylene-, and ethylene-butylene copolymer-coated or laminated paper, synthetic papers, and pigment-containing polyesters. Of these support materials, films of cellulose triacetate, poly(ethylene terephthalate), and poly(ethylene naphthalate) prepared from 2,6-naphthalene dicarboxylic acids or derivatives thereof are preferred.

The thickness of the support is not particularly critical. Support thickness of 2 to 10 mils (50 $\mu$m to 254 $\mu$m) are generally suitable for the materials of the present invention.

Aqueous dispersions of electronically-conductive polymer particles can be prepared in the presence of appropriate levels of optional dispersing aids, colloidal stabilizing agents or polymeric co-binders by any of various mechanical stirring, mixing, homogenization or blending processes. Alternatively, stable colloidal dispersions of suitable electronically conductive polymer particles can be obtained commercially, for example, a stabilized dispersion of thiophene-containing polymer supplied by Bayer Corporation as Baytron® P. Formulated dispersions containing electronically-conductive polymer particles and the preferred combination of charge control agents, polymeric binder(s), and additives can be applied to the aforementioned film or paper supports by any of a variety of well-known coating methods. Hand coating techniques include using a coating rod or knife or a doctor blade. Machine coating methods include air doctor coating, reverse roll coating, gravure coating, curtain coating, bead coating, slide hopper coating, extrusion coating, spin coating and the like, and other coating methods well known in the art.

The electrically conductive antistatic layer of this invention can be applied to the support at any suitable coverage depending on the specific requirements of a particular type of imaging element. For example, for silver halide photographic films, dry coating weights of the preferred electrically conductive polymer particles dispersion in a conductive overcoat layer are preferably in the range of from about 0.001 to about 2 g/m$^2$. More preferred dry coverage is in the range of from about 0.01 to about 1 g/m$^2$.

The conductive layers used in this invention typically exhibit a surface resistivity (at 20% relative humidity and 20° C.) of less than $1\times10^{12}$ ohms/square, preferably less than $1\times10^{10}$ ohms/square, and more preferably less than $1\times10^{8}$ ohms/square.

The imaging materials of this invention can be of many different types depending on the particular use for which they are intended. Such imaging elements include, for example, photographic, thermographic, electrothermographic, photothermographic, dielectric recording, dye migration, laser dye-ablation, thermal dye transfer, electrostatographic, and electrophotographic imaging elements. Details with respect to the composition and function of this wide variety of imaging elements are well known in the art. Particularly useful imaging materials are photosensitive imaging materials that provide color or black and white images and include one or more image-forming layers that include one or one more photosensitive silver halides.

Such photosensitive layers can contain silver halides such as silver chloride, silver bromide, silver bromoiodide, silver chlorobromide and others well known in the art. Both negative and reversal silver halide elements are contemplated for photographic materials. For reversal films, the emulsion layers described in U.S. Pat. No. 5,236,817 (especially Examples 16 and 21) are particularly suitable. Any of the known silver halide emulsion layers, such as those described in *Research Disclosure*, Vol. 176, Item 17643 (December, 1978) and *Research Disclosure*, Vol. 225, Item 22534 (January, 1983), and *Research Disclosure*, Item 36544 (September, 1994), and *Research Disclosure*, Item 37038 (February, 1995) and the references cited therein are useful in preparing photographic materials in accordance with this invention.

Photographic materials of this invention can differ widely in structure and composition. For example, they can vary greatly with regard to the type of support, the number and composition of the image-forming layers, the number and location of the electrically conductive layers, and the number and types of auxiliary layers that are included in the elements. In particular, photographic elements can be still films, motion picture films, radiographic films, graphic arts films, paper prints or microfiche. It is also specifically contemplated to use the electrically conductive layers in small format films as described in *Research Disclosure*, Item 36230 (June 1994). Photographic materials can be either black-and-white or monochrome elements or multilayer and/or multicolor elements adapted for use in a negative-positive process or a reversal process. Generally, the photographic element is prepared by coating one side of the film support with one or more layers comprising a dispersion of silver halide crystals in an aqueous solution of gelatin and optionally one or more subbing layers. Preparation and composition of such materials is well known in the art. For multicolor, multi-layer materials, layers can be coated simultaneously on the composite film support as described in U.S. Pat. Nos. 2,761,791 and 3,508,947. Additional useful coating and drying procedures are described in *Research Disclosure*, Vol. 176, Item 17643 (December, 1978).

Electrically conductive layers described herein can be incorporated into multilayer imaging materials in any of various configurations depending upon the requirements of the specific application. An electrically conductive layer can be applied as an interlayer or directly over the sensitized image-forming layer(s), on the back side of the support opposite the image-forming layer(s), as well as on both sides of the support. When the electrically conductive layer is applied over an image-forming emulsion layer, it may not be necessary to apply any intermediate layers such as barrier layers or adhesion-promoting layers between the conductive layer and the emulsion layer(s), although they can optionally be present.

Alternatively, an electrically conductive layer can be applied on the backside as part of or in addition to layers used to control curl (that is, a pelloid layer). In the case of photographic elements used for direct or indirect exposure to X-radiation, the electrically conductive layer can be applied on either or both sides of the support.

In some photographic materials, the electrically conductive layer is present on only one side of the support and one or more photosensitive emulsion layers are present on both sides of the support. In other materials, one or more photosensitive emulsion layers are on only one side of the support and a pelloid layer that contains gelatin is on the backside of the support.

Electrically conductive layers of this invention can be incorporated as interlayers between one or more photosensitive emulsion layer(s) or between pelloid layers, or both.

The electrically conductive layers described herein can also be incorporated in an imaging material comprising a support, one or more image-forming layers, and a transparent magnetic recording layer containing magnetic particles dispersed in a polymeric binder. Such imaging materials are well-known and are described, for example, in U.S. Pat. Nos. 3,782,947, 4,279,945, 4,302,523, 4,990,276, 5,147, 768, 5,215,874, 5,217,804, 5,227,283, 5,229,259, 5,252,441, 5,254,449, 5,294,525, 5,335,589, 5,336,589, 5,382,494, 5,395,743, 5,397,826, 5,413,900, 5,427,900, 5,432,050, 5,457,012, 5,459,021, 5,491,051, 5,498,512, 5,514,528, and in *Research Disclosure*, Item No. 34390 (November, 1992) and references cited therein, all of which publications are incorporated herein by reference. Such materials are particularly advantageous because they can be employed to record images by the customary imaging processes while at the same time additional information can be recorded into and read from a transparent magnetic layer by techniques similar to those employed in the magnetic recording art. The transparent magnetic recording layer comprises a film-forming polymeric binder, magnetic particles, and other optional addenda for improved manufacturability or performance such as dispersants, coating aids, fluorinated surfactants, crosslinking agents or hardeners, catalysts, charge control agents, lubricants, abrasive particles, filler particles, and plasticizers. The magnetic particles can consist of ferromagnetic oxides, complex oxides including other metals, metal alloy particles with protective oxide coatings, ferrites, and hexagonal ferrites and can exhibit a wide variety of shapes, sizes, and aspect ratios. Such magnetic particles also can contain a variety of metal dopants and optionally can be overcoated with a shell of particulate inorganic or polymeric materials to decrease light scattering as described in U.S. Pat. Nos. 5,217,804 and 5,252,444. The preferred ferromagnetic particles for use in transparent magnetic recording layers used in combination with the electrically conductive overcoat layers of this invention are cobalt surface-treated $\gamma\text{-Fe}_2\text{O}_3$ or magnetite with a specific surface area (BET) greater than 30 $m^2/g$.

The transparent, electrically conductive layers described herein can be incorporated over the image-forming emulsion layer(s) or over the transparent magnetic recording layer on back side of the support.

Thermally sensitive imaging materials are well known and some representative embodiments are described in U.S. Pat. Nos. 6,368,779B1, 6,355,408B1, 6,355,405B1, 6,352, 820B1, 6,352,819B1, 6,319,661B1, 5,998,126, 6,284, 442B1, and references noted therein, all of which are incorporated hereby by reference.

The following embodiments are within the scope of the present invention, but the invention is not to be construed as so limited where there is broader language in this disclosure:

6. The multilayer imaging material noted above comprising an outer surface layer on either side of said subbed or unsubbed support, and wherein the one or more electrically conductive, non-charging layers are interlayers located on either side of the subbed or unsubbed support and between the subbed or unsubbed support and said outer surface layer on either side of said subbed or unsubbed support.

7. The multilayer imaging material noted above wherein the one or more electrically conductive, non-charging interlayers are located between the subbed or unsubbed support and the one or more image-forming layers.

8. The multilayer imaging material noted above comprising two or more image-forming layers, and wherein the one or more electrically conductive, non-charging interlayers are located between two or more image-forming layers.

9. The multilayer imaging material noted above wherein the one or more electrically conductive, non-charging layers are located farther from the subbed or unsubbed support than the one or more image-forming layers.

11. The multilayer imaging material noted above wherein the colloidal, electrically conductive polymer particles exhibit a packed powder specific resistivity of $10^5$ ohm cm or less.

12. The multilayer imaging material noted above wherein the colloidal, electrically conductive polymer particles have a mean diameter of less than or equal to 0.5 $\mu$m.

13. The multilayer imaging material noted above wherein the colloidal, electrically conductive polymer particles have a mean diameter of less than or equal to 0.05 $\mu$m.

14. The multilayer imaging material noted above wherein the colloidal, electrically conductive polymer particles have a mean diameter of less than or equal to 0.025 $\mu$m.

23. The multilayer imaging material noted above wherein the film-forming binder comprises an organic solvent-soluble polymer.

24. The multilayer imaging material noted above wherein the film-forming binder comprises a water-dispersible, water-insoluble polymer.

27. The multilayer imaging material noted above wherein the one or more electrically conductive, non-charging layers is disposed directly over one or more of the image-forming layers.

28. The multilayer imaging material noted above further comprising an interlayer between the one or more image-forming layers and the one or more electrically conductive non-charging layers.

29. The multilayer imaging material noted above wherein the one or more electrically conductive, non-charging layers are on the backside of the imaging material.

30. The multilayer imaging material noted above wherein the one or more electrically conductive, non-charging layers comprise an antihalation dye or antihalation-dye forming composition.

31. The multilayer imaging material noted above further comprising one or more non-electrically conductive layers in association with the one or more electrically conductive, non-charging layers on the back side of the imaging material.

32. A photographic material comprising:
a subbed or unsubbed support,
one or more silver halide emulsion layers on one or both sides of the subbed or unsubbed support, and
over the one or more silver halide emulsion layers, one or more transparent electrically conductive, non-charging layers each of which comprises colloidal, electrically conductive polymer particles dispersed in a film-forming binder in an amount to provide from about 10 to about 90 volume % polymer particles, and one or more charge control agents to minimize triboelectrification,
wherein the colloidal, electrically conductive polymer particles have a mean diameter less than or equal to 0.5 μm and are composed of a substituted or unsubstituted pyrrole-containing polymer, a substituted or unsubstituted thiophene-containing polymer, or a substituted or unsubstituted aniline-containing polymer.

33. The photographic material noted above that is a black-and-white photographic film.

34. The photographic material noted above that is a color negative film, a color positive film, or a color paper.

35. A photographic material comprising:
a subbed or unsubbed support,
one or more silver halide emulsion layers on one side of the subbed or unsubbed support, and
on the back side of the subbed or unsubbed support, one or more transparent electrically conductive, non-charging layers,
each of the one or more electrically conductive, non-charging layers comprising colloidal, electrically conductive polymer particles dispersed in a film-forming binder in an amount to provide from about 10 to about 90 volume % polymer particles, and one or more charge control agents to minimize triboelectrification,
wherein the colloidal, electrically conductive polymer particles have a mean diameter less than or equal to 0.5 μm and are composed of a substituted or unsubstituted pyrrole-containing polymer, a substituted or unsubstituted thiophene-containing polymer, or a substituted or unsubstituted aniline-containing polymers.

36. A thermally-developable imaging material comprising:
a subbed or unsubbed support,
one or more image-forming, thermally-developable layers one or both sides of the subbed or unsubbed support, and
over the one or more image-forming, thermally-developable layers, one or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification,
wherein the colloidal, electrically conductive polymer particles have a mean diameter less than or equal to 0.5 μm and are composed of a substituted or unsubstituted pyrrole-containing polymer, a substituted or unsubstituted thiophene-containing polymer, or a substituted or unsubstituted aniline-containing polymer.

37. The thermally-developable imaging material noted above that is a photothermographic material.

38. A thermally-developable imaging material comprising:
a subbed or unsubbed support,
one or more image-forming, thermally-developable layers on one side of the subbed or unsubbed support, and
on the back side of the subbed or unsubbed support, one or more transparent electrically conductive, non-charging layers,
each of the one or more electrically conductive, non-charging layers comprising colloidal, electrically conductive polymer particles dispersed in a film-forming binder in an amount to provide from about 10 to about 90 volume % polymer particles, and one or more charge control agents to minimize triboelectrification,
wherein the colloidal, electrically conductive polymer particles have a mean diameter less than or equal to 0.5 μm and are composed of a substituted or unsubstituted pyrrole-containing polymer, a substituted or unsubstituted thiophene-containing polymer, or a substituted or unsubstituted aniline-containing polymer.

39. A thermographic imaging material comprising:
a subbed or unsubbed support,
one or more thermally-sensitive imaging layers one or both sides of the subbed or unsubbed support, and
over the one or more image-forming, thermally-developable layers, one or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification,
wherein the colloidal, electrically conductive polymer particles have a mean diameter less than or equal to 0.5 μm and are composed of substituted or unsubstituted pyrrole-containing polymer, a substituted or unsubstituted thiophene-containing polymer, or a substituted or unsubstituted aniline-containing polymer.

40. A photographic material comprising:
a subbed or unsubbed support,
one or more silver halide emulsion layer on one side of the subbed or unsubbed support,
a transparent magnetic recording layer on the back side of the subbed or unsubbed support, the transparent magnetic recording layer comprising ferromagnetic particles dispersed in a film-forming polymeric binder, and
over the one or more silver halide emulsion layers one, or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification, wherein the colloidal, electrically conductive polymer particles have a mean diameter less than or equal to 0.5 μm and are composed of a substituted or unsubstituted pyrrole-containing polymer, a substituted or unsubstituted thiophene-containing polymer, or a substituted or unsubstituted aniline-containing polymer.

The following examples are provided to illustrate the practice of the present invention and are not meant to be limiting in any manner.

EXAMPLES 1 and 2

Color negative film samples of the present invention were prepared and compared to a conventional color negative film in the following manner.

An electrically conductive, non-charging composition was prepared for use in the film samples. This composition was prepared by mixing the following materials in the order shown (weight %) at a temperature of 60° C. with constant agitation.

| Water | 54.55% |
| --- | --- |
| Gelatin | 0.53% |
| Ethylene glycol | 9.26% |
| Baytron ® P (available from Bayer corporation) | 35.61% |
| Coating surfactant | 0.05% |

Samples of conventional and commercially available Kodak Max Versatility Plus 800™ film were used as a Control for comparison purposes.

In Example 1, film samples were prepared just like the Control except that the composition described above was coated just below the protective overcoat (above the silver halide emulsion layers) in the film structure at a wet coverage of 4.65 g/m².

In Example 2, film samples were prepared just like the Control except that the noted composition was coated immediately over the protective overcoat in the film structure at a wet coverage of 4.65 g/m².

The electrical resistivity of the three different types of film samples was measured according to the procedures described in R. A. Elder, "Resistivity Measurements on Buried Conductive Layers", EOS/ESD Symposium proceedings, September 1990, pages 251–254. The results are shown in TABLE I below.

The film samples were then exposed to white light and processed using the well-known Process C-41 color processing protocol, conditions, and processing solutions (that is, KODAK FLEXICOLOR processing chemicals).

Optical density was measured after processing to verify that all of the film samples could provide color images.

TABLE I

| Sample | Resistivity (ohm/square) | Density after processing |
| --- | --- | --- |
| Control | $4.0 \times 10^8$ | 1.99 |
| Example 1 | $1.0 \times 10^6$ | 2.14 |
| Example 2 | $2.5 \times 10^6$ | 1.71 |

The results show that the imaging materials of the present invention have significantly lower resistivity than the Control film, indicating that the electrically conductive composition provided a highly conductive layer. When incorporated into a non-conductive film such a layer would therefore be expected to provide all of the advantages expected of a conductive film. The ability of the imaging materials to capture and display an image is preserved when preparing film according to the present invention.

The invention has been described in detail with particular reference to preferred embodiments thereof, but it will be understood that variations and modifications can be effected within the spirit and scope of the invention.

We claim:

1. A multilayer imaging material for use in all image-forming process comprising a subbed or unsubbed support, and having disposed thereon, one or more image-forming layers and one or more transparent electrically conductive, non-charging layers each of which comprises colloidal, electronically conductive polymer particles, and a combination of charge control agents, said combination comprising one or more positively-charging charge control agents and one or more negatively-charging charge control agents, said one or more negatively-charging charge control agents being selected from either or both of the following two groups of charge control agents, (i) and (ii):

(i) an anionic charge control agent represented by the formula (1) or (2),

$$R\text{—}(A)\text{—}SO^-_3M^+ \quad (1)$$

wherein R represents an alkyl, alkenyl group, or alkylaryl group, A represents a single covalent bond —O—, —(OCH$_2$CH$_2$)$_m$—O$_n$—, or —CONR$_1$—(CH$_2$)— wherein m is an integer from 1 to 8 and n is zero or 1, R$_1$ represents hydrogen or an alkyl group having 1, 2, or 3 carbon atoms and M$^+$ represents an alkali metal cation, an ammonium ion, or a guaternary ammonium ion,

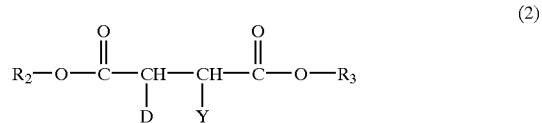

(2)

wherein R$_2$ and R$_3$ represent the same or different alkyl group or aryl group, either D or Y is hydrogen and the other is —SO$_3$M, wherein M is a cation as defined above for formula (1), (ii) a fluorine-containing anionic charge control agent having a fluoroalkyl, fluoroalkenyl, or fluoroalkylaryl group, and a sulfonate, sulfate, carboxylate, or phosphate group, represented by the following formula (3), (4), or (5),

(3)

wherein R$_f$ represents a fluorinated alkyl, aryl, alkenyl, or alkylaryl group having 6 to 14 carbon atoms and at least 7 fluorine atoms with 3 fluorine atoms on the end carbon atom; R$_4$ represents a methyl or ethyl group or hydrogen; n has a value of 0 or 1, "a" has a value of 0 or 1, 2, 3, or 4, and B represents —SO$_3$M, —OSO$_3$M, —CO$_2$M, or —OPO$_3$M$_2$, where M is a cation as defined above for formula (1),

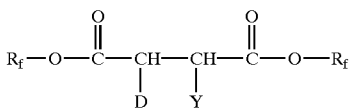

wherein $R_f$ and $R'_f$ represent the same or different fluorinated alkylaryl group having 4 to 10 carbon atoms and at least 7 fluorine atoms, with 3 fluorine atoms on the end carbon atom, either D or Y is hydrogen and the other is —$SO_3M$ wherein M is a cation defined above for formula (1), and (5) a mixture of

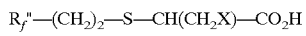

and

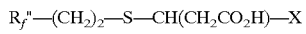

wherein $R_f''$ represents a mixture of perfluorinated alkyl groups having 6, 8, 10, and 12 carbon atoms, and X is —$CONH(CH_2)_3N(CH_3)_2$.

2. The multilayer imaging material of claim 1 wherein said colloidal, electrically conductive polymer particles are dispersed in a film-forming binder in an amount to provide from about 10 to about 90 volume % polymer particles.

3. The multilayer imaging material of claim 1 wherein said one or more electrically conductive, non-charging layers is disposed directly over said one or more image-forming layers.

4. The multilayer imaging material of claim 1 wherein said positively-charging and negatively-charging charge control agents are present in each of said one or more electrically conductive, non-charging layers in an amount of from about 0.0001 to about 1 $g/m^2$.

5. The multilayer imaging material of claim 2 wherein said polymer particles are dispersed in said film-forming binder in an amount to provide from about 20 to about 80 volume %.

6. The multilayer imaging material of claim 1 comprising an outer surface layer on either side of said subbed or unsubbed support, and wherein said one or more electrically conductive, non-charging layers are interlayers located on either side of said subbed or unsubbed support and between said subbed or unsubbed support and said outer surface layer on either side of said subbed or unsubbed support.

7. The multilayer imaging material of claim 6 wherein said one or more electrically conductive, non-charging interlayers are located between said subbed or unsubbed support and said one or more image-forming layers.

8. The multilayer imaging material of claim 6 comprising two or more image-forming layers, and wherein said one or more electrically conductive, non-charging interlayers are located between said two or more image-forming layers.

9. The multilayer imaging material of claim 1 wherein said one or more electrically conductive, non-charging layers are located farther from said subbed or unsubbed support than said one or more image-forming layers.

10. The multilayer imaging material of claim 1 wherein said colloidal electrically conductive polymer particles are composed of a substituted or unsubstituted pyrrole-containing polymer, a substituted or unsubstituted thiophene-containing polymer, or a substituted or unsubstituted aniline-containing polymer.

11. The multilayer imaging material of claim 1 wherein said colloidal, electrically conductive polymer particles exhibit a packed powder specific resistivity of $10^5$ ohm·cm or less.

12. The multilayer imaging material of claim 1 wherein said colloidal, electrically conductive polymer particles have a mean diameter of less than or equal to 0.5 $\mu$m.

13. The multilayer imaging material of claim 10 wherein said colloidal, electrically conductive polymer particles have a mean diameter of less than or equal to 0.05 $\mu$m.

14. The multilayer imaging material of claim 1 wherein said colloidal, electrically conductive polymer particles have a mean diameter of less than or equal to 0.025 $\mu$m.

15. The multilayer imaging material of claim 1 wherein each of said one or more electrically conductive, non-charging layers comprises a dry weight coverage of colloidal, electrically conductive polymer particles ranging from 0.001 to 2 $g/m^2$.

16. The multilayer imaging material of claim 15 wherein each of said electrically conductive, non-charging layers comprises a dry weight coverage of colloidal, electrically conductive polymer particles ranging from 0.01 to 1 $g/m^2$.

17. The multilayer imaging material of claim 1 wherein each of said one or more electrically conductive, non-charging layers has a surface electrical resistivity of less than $1 \times 10^{12}$ ohm per square.

18. The multilayer imaging material of claim 17 wherein each of said one or more electrically conductive, non-charging layers has a surface electrical resistivity of less than $1 \times 10^{10}$ ohm per square.

19. The multilayer imaging material of claim 18 wherein each of said one or more electrically conductive, non-charging layers has a surface electrical resistivity of less than $1 \times 10^8$ ohm per square.

20. The multilayer imaging material of claim 3 further comprising an interlayer between said one or more image-forming layers and said one or more electrically conductive, non-charging layers.

21. The multilayer imaging material of claim 2 wherein said film-forming binder comprises a water-soluble hydrophilic polymer.

22. The multilayer imaging material of claim 2 wherein said film-forming binder comprises gelatin, gelatin derivative, or a cellulose derivative.

23. The multilayer imaging material of claim 2 wherein said film-forming binder comprises an organic solvent-soluble polymer.

24. The multilayer imaging material of claim 2 wherein said film-forming binder comprises a water-dispersible, water-insoluble polymer.

25. The multilayer imaging material of claim 1 wherein said subbed or unsubbed support comprises a poly(ethylene terephthalate), poly(ethylene naphthalate) film, or cellulose acetate film.

26. The multilayer imaging material of claim 1 wherein said subbed or unsubbed support comprises an uncoated paper, a polymer coated paper, a laminated paper, or a synthetic paper.

27. The multilayer imaging material of claim 1 wherein said one or more electrically conductive, non-charging layers are on the backside of said imaging material.

28. The multilayer imaging material of claim 27 wherein said one or more electrically conductive, non-charging layers comprise an antihalation dye or antihalation-dye forming composition.

29. The multilayer imaging material of claim 27 further comprising one or more non-electrically conductive layers in association with said one or more electrically conductive, non-charging layers on the backside of said imaging material.

30. A photographic material comprising:
a subbed or unsubbed support,
one or more silver halide emulsion layers on one or both sides of said subbed or unsubbed support, and over said one or more silver halide emulsion layers, one or more transparent electrically conductive, non-charging layers each of which comprises colloidal, electrically conductive polymer particles dispersed in a film-forming binder in an amount to provide from about 10 to about 90 volume % polymer particles, and one or more charge control agents to minimize triboelectrification, wherein said electrically conductive colloidal, electrically conductive polymer particles have a mean diameter less than or equal to 0.5 µm and are composed of a substituted or unsubstituted pyrrole-containing polymer, a substituted or unsubstituted thiophene-containing polymer, or a substituted or unsubstituted aniline-containing polymer.

31. The photographic material of claim 30 that is a black-and-white photographic film.

32. The photographic material of claim 30 that is a color negative film, a color positive film, or a color paper.

33. A photographic material comprising:
a subbed or unsubbed support,
one or more silver halide emulsion layers on one side of said subbed or unsubbed support, and
on the back side of said subbed or unsubbed support, one or more transparent electrically conductive, non-charging layers,
each of said one or more electrically conductive, non-charging layers comprising colloidal, electrically conductive polymer particles dispersed in a film-forming binder in an amount to provide from about 10 to about 90 volume % polymer particles, and a combination of charge control agents to minimize triboelectrification,
wherein said electrically conductive colloidal, electrically conductive polymer particles have a mean diameter less than or equal to 0.5 µm and are composed of substituted or unsubstituted pyrrole-containing polymer, a substituted or unsubstituted thiophene-containing polymer, or a substituted or unsubstituted aniline-containing polymers,
said combination of charge control agents comprising one or more positively-charging charge control agents and one or more negatively-charging charge control agents, said one or more negatively-charging charge control agents being selected from either or both of the following two groups of charge control agents, (i) and (ii):
(i) an anionic charge control agent represented by the formula (1) or (2),

R—(A)—SO⁻₃M⁺      (1)

wherein R represents an alkyl, alkenyl group, or alkylaryl group, A represents a single covalent bond, —O—, —(OCH₂CH₂)$_m$—O$_n$—, or —CONR₁—(CH₂)13 wherein m is an integer from 1 to 8 and n is zero or 1, R₁ represents hydrogen or an alkyl group having 1, 2, or 3 carbon atoms and M⁺ represents an alkali metal cation, an ammonium ion, or a quaternary ammonium ion,

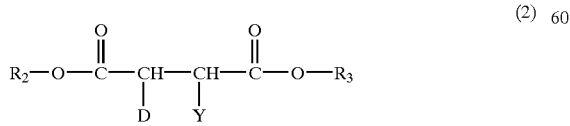

(2)

wherein R₂ and R₃ represent the same or different alkyl group or aryl group, either D or Y is hydrogen and the other is —SO₃M, wherein M is a cation as defined above for formula (1), (ii) a fluorine-containing anionic charge control agent having a fluoroalkyl, fluoroalkenyl, or fluoroalkylaryl group, and a sulfonate, sulfate, carboxylate, or phosphate group, represented by the following formula (3), (4), or (5),

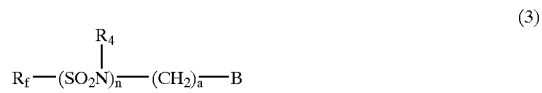

(3)

R$_f$—(SO₂N)$_{\overline{n}}$—(CH₂)$_{\overline{a}}$—B wherein R$_f$ represents a fluorinated alkyl, aryl, alkenyl, or alkylaryl group having 6 to 14 carbon atoms and at least 7 fluorine atoms with 3 fluorine atoms on the end carbon atom; R₄ represents a methyl or ethyl group or hydrogen; n has a value of 0 or 1, "a" has a value of 0 or 1, 2, 3, or 4, and B represents —SO₃M, —OSO₃M, —CO₂M, or —OPO₃M₂, where M is a cation as defined above for formula (1),

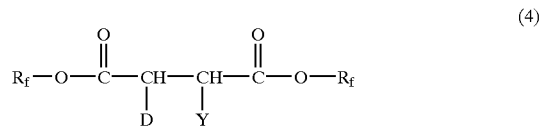

(4)

wherein R$_f$ and R'$_f$ represent the same or different fluorinated alkylaryl group having 4 to 10 carbon atoms and at least 7 fluorine atoms, with 3 fluorine atoms on the end carbon atom, either D or Y is hydrogen and the other is —SO₃M wherein M is a cation defined above for formula (1), and (5) a mixture of R$_f''$—(CH₂)₂—S—CH(CH₂X)—CO₂H and R$_f''$—(CH₂)₂—S—CH(CH₂CO₂H)—X      (5)

wherein R$_f''$ represents a mixture of perfluorinated alkyl groups having 6, 8, 10, and 12 carbon atoms, and X is —CONH(CH₂)₃N(CH₃)₂.

34. A thermally-developable imaging material comprising:
a subbed or unsubbed support,
one or more image-forming, thermally-developable layers on one or both sides of said subbed or unsubbed support, and
over said one or more image-forming, thermally-developable layers, one or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification,
wherein said colloidal, electrically conductive polymer particles have a mean diameter less than or equal to 0.5 µm and are composed of substituted or unsubstituted pyrrole-containing polymer, a substituted or unsubstituted thiophene-containing polymer, or a substituted or unsubstituted aniline-containing polymer.

35. The thermally-developable imaging material of claim 34 that is a photothermographic material.

36. A thermally-developable imaging material comprising:
a subbed or unsubbed support,
one or more image-forming, thermally-developable layers on one side of said subbed or unsubbed support, and
on the back side of said subbed or unsubbed support, one or more transparent electrically conductive, non-charging layers,
each of said one or more electrically conductive, non-charging layers comprising colloidal, electrically conductive polymer particles dispersed in a film-forming binder to provide an amount of from about 10 to about 90 volume % polymer particles, and a combination of charge control agents to minimize triboelectrification,
wherein said colloidal, electrically conductive polymer particles have a mean diameter less than or equal to 0.5 µm and are composed of a substituted or unsubstituted pyrrole-containing polymer, a substituted or unsubstituted thiophene-containing polymer, or a substituted or unsubstituted aniline-containing polymer,
said combination of charge control agents comprising one or more positively-charging charge control agents and one or more negatively-charging charge control agents, said one or more negatively-charging charge control agents being selected from either or both of the following two groups of charge control agents, (i) and (ii):
(i) an anionic charge control agent represented by the formula (1) or (2),

(1)

wherein R represents an alkyl, alkenyl group, or alkylaryl group, A represents a single covalent bond, —O—, —(OCH$_2$CH$_2$)$_m$—O$_n$—, or —CONR$_1$—(CH$_2$)— wherein m is an integer from 1 to 8 and n is zero or 1, R$_1$ represents hydrogen or an alkyl group having 1, 2, or 3 carbon atoms and M$^+$ represents an alkali metal cation, an ammonium ion, or a quaternary ammonium ion,

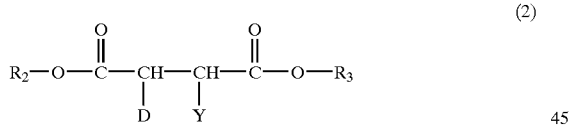
(2)

wherein R$_2$ and R$_3$ represent the same or different alkyl group or aryl group, either D or Y is hydrogen and the other is —SO$_3$M, wherein M is a cation as defined above for formula (1),
(ii) a fluorine-containing anionic charge control agent having a fluoroalkyl, fluoroalkenyl, or fluoroalkylaryl group, and a sulfonate, sulfate, carboxylate, or phosphate group, represented by the following formula (3), (4), or (5),

(3)

wherein Rf represents a fluorinated alkyl, aryl, alkenyl, or alkylaryl group having 6 to 14 carbon atoms and at least 7 fluorine atoms with 3 fluorine atoms on the end carbon atom; R$_4$ represents a methyl or ethyl group or hydrogen; n has a value of 0 or 1, "a" has a value of 0 or 1, 2, 3, or 4, and B represents —SO$_3$M, —OSO$_3$M, —CO$_2$M, or —OPO$_3$M$_2$, where M is a cation as defined above for formula (1),

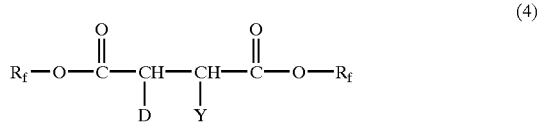
(4)

wherein R$_f$ and R'$_f$ represent the same or different fluorinated alkylaryl group having 4 to 10 carbon atoms and at least 7 fluorine atoms, with 3 fluorine atoms on the end carbon atom, either D or Y is hydrogen and the other is —SO$_3$M wherein M is a cation defined above for formula (1), and
(5) a mixture of

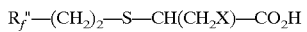

and

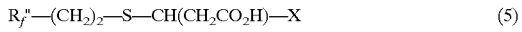
(5)

wherein R$_f$" represents a mixture of perfluorinated alkyl groups having 6, 8, 10, and 12 carbon atoms, and X is —CONH(CH$_2$)$_3$N(CH$_3$)$_2$.

37. A thermographic imaging material comprising:
a subbed or unsubbed support,
one or more thermally-sensitive imaging layers on one or both sides of said subbed or unsubbed support, and
over said one or more image-forming, thermally-developable layers, one or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification,
wherein said colloidal, electrically conductive polymer particles have a mean diameter less than or equal to 0.5 µm and are composed of substituted or unsubstituted pyrrole-containing polymer, a substituted or unsubstituted thiophene-containing polymer, or a substituted or unsubstituted aniline-containing polymer.

38. A photographic material comprising:
a subbed or unsubbed support,
one or more silver halide emulsion layer on the front side of said subbed or unsubbed support,
a transparent magnetic recording layer on the back side of said subbed or unsubbed support, said transparent magnetic recording layer comprising ferromagnetic particles dispersed in a film-forming polymeric binder, and
over said one or more silver halide emulsion layers, one or more transparent electrically conductive, non-charging layers, each of which comprises colloidal, electrically conductive polymer particles dispersed in a film-forming binder in an amount to provide from about 10 to about 90 volume % polymer particles, and one or more charge control agents to minimize triboelectrification, wherein said colloidal, electrically conductive polymer particles have a mean diameter less than or equal to 0.5 µm and are composed of a substituted or unsubstituted pyrrole-containing polymer, a substituted or unsubstituted thiophene-containing polymer, or a substituted or unsubstituted aniline-containing polymer.

* * * * *